United States Patent [19]

Menke

[11] 4,235,664
[45] Nov. 25, 1980

[54] UNITARY TYPE-CARRIER ELEMENTS AND METHOD OF MAKING SAME

[75] Inventor: Jon F. Menke, Cokato, Minn.

[73] Assignee: Hutchinson Industrial Corporation, Hutchinson, Minn.

[21] Appl. No.: 53,408

[22] Filed: Jun. 29, 1979

[51] Int. Cl.³ .............................................. C23F 1/02
[52] U.S. Cl. .............................. 156/645; 156/661.1; 156/905; 400/144.2
[58] Field of Search .................. 101/46, 93.18, 93.19, 101/93.28, 109, 110; 400/144.1, 144.2, 144.3, 145.1, 145.2, 156.1, 157.1, 174; 156/640, 645, 650, 651, 654, 656, 661.1, 905; 430/300, 306, 307, 310

[56] References Cited

U.S. PATENT DOCUMENTS

| | | | |
|---|---|---|---|
| 2,521,648 | 9/1950 | Ott | 156/661.1 |
| 2,744,986 | 5/1956 | Caldwell | 156/656 X |
| 3,148,098 | 9/1964 | Beste | 156/659.1 X |
| 3,962,002 | 6/1976 | Finkbeiner et al. | 156/661.1 X |
| 4,021,906 | 5/1977 | Takahiki | 156/659.1 X |
| 4,044,455 | 8/1977 | Watanabe et al. | 400/157.1 X |
| 4,070,752 | 1/1978 | Robinson | 156/659.1 X |

*Primary Examiner*—William A. Powell
*Attorney, Agent, or Firm*—Schroeder, Siegfried, Ryan, Vidas, Steffey & Arrett

[57] ABSTRACT

One-piece type-carrier elements made by etching.

14 Claims, 10 Drawing Figures

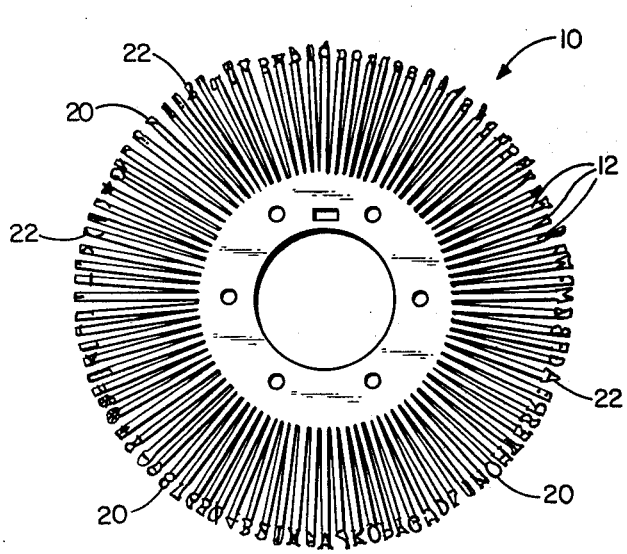
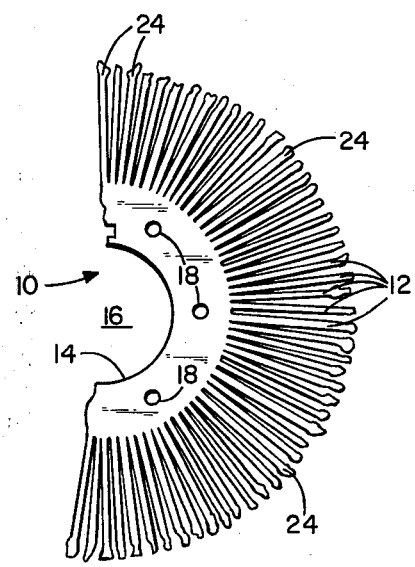
FIG. 1  FIG. 2
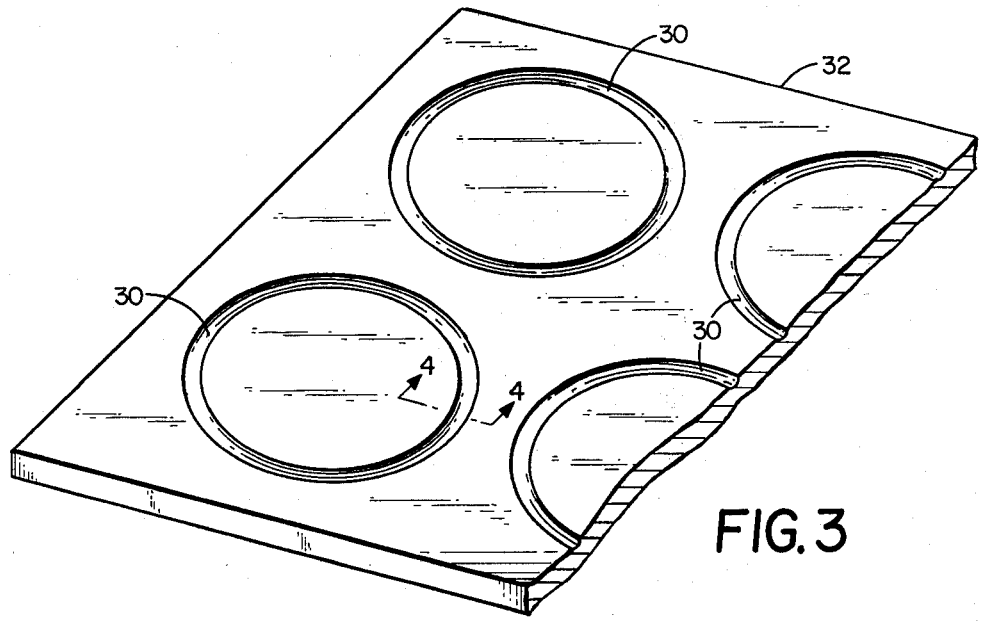
FIG. 3
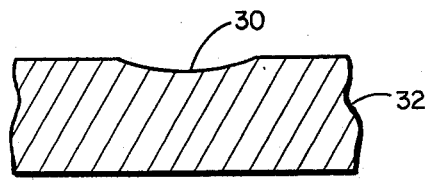
FIG. 4

UNITARY TYPE-CARRIER ELEMENTS AND METHOD OF MAKING SAME

DESCRIPTION

BACKGROUND OF PRIOR ART

This invention relates to impact printers and specifically to the character carrying elements, print-carrier or type-carrier elements used in impact printers. The invention is specifically concerned with a new and improved type-carrier element as an article of manufacture and with a method of making same.

In impact printers, there is typically utilized a rotatable print disc, barrel, thimble, or the like comprising a type-carrier element and a hub mounting arrangement. The type-carrier element has a plurality of flexible spaced-apart radially-distributed finger or arm members with print characters thereon. These arms are disposed at angular increments around a center portion which is designated to be rotatably mounted in the impact printer. The print carrying arms are positioned in the printer so as to be generally parallel to the plane of a surface which is to receive the printing such as a sheet of paper. To print any desired character, the type-carrier element is rotated by a driving mechanism in the printer to a position corresponding to the selected print character on one of the arms. The character is then printed by hammering the arm into contact with an inked ribbon and against the paper.

The rotatable type-carrier element may, as indicated above, take various forms such as discs, barrels, thimbles, and the like. One of the more popular forms is the planar disc-shaped element used in the print disc commonly referred to as the "daisy wheel". Another is referred to as a "thimble" because of its thimble-like appearance in which a center portion carries the spaced arms extending generally upwardly therefrom. Herein, all of these various types and styles of carrier elements are recognized as including a center portion having a plurality of arms extending peripherally therefrom, whether in the same plane as the center portion or angularly thereto. Such elements are referred to collectively herein as print-carrier or type-carrier elements. In use, the element itself consisting of the center portion and radially extending arms may be fitted with various kinds of hub fittings and the like for rotatably mounting the element, indexing it, and so forth. The present invention is specifically concerned with the type-carrier element itself and its fabrication.

Typical prior art type-carrier elements make use of type character or type slugs which are integrally molded at the ends of the arms. Various portions of the carrier elements, sometimes both the arms and the type or print character slugs may be made of thermoplastic materials. In some of the prior art elements, the arms are formed from metal and the character slugs are molded plastic formed on or attached to the arm ends. The slugs carry the type characters for printing and are sometimes covered with a metalized surface coating for increased life. Metal slugs have also been used by welding them to the arm ends individually. Composite structures of plastic and metal suffer from relatively short life. Typical problems due to the use of plastics are arm breakage and character face degradation. Welded carrier elements formed completely of metal have not been used successfully because of their relatively high weight and high inertia.

It is an object of this invention to provide rotatable metal print-carrier elements of one-piece, having integrally formed print characters thereon.

It is another object of this invention to provide type-carrier elements which possess extended useful life.

It is another object of the invention to provide all-metal print-carrier elements of low inertia and low weight.

It is also an object of the invention to provide a method of making such type-carrier elements, particularly by a method wherein a one-piece element of metal is made in such a manner as to avoid having stresses therein.

These and other objects of the invention will become more apparent from the description hereinbelow which sets forth a method of making type-carrier elements wherein a negative photoresist material is used.

BRIEF SUMMARY OF THE INVENTION

This invention provides a metal one-piece type-carrier element with integrally formed type characters on the extending arms thereof. It is formed by chemical milling, as by etching. Hereinafter, the term "etching" shall be taken to mean all equivalent "chemical milling" techniques.

BRIEF DESCRIPTION OF THE DRAWINGS

FIG. 1 is a top plan view of a type-carrier element according to the invention.

FIG. 2 is a bottom plan view of a fragment of the type-carrier element of FIG. 1.

FIG. 3 is a schematic perspective view in fragment of a metal sheet in initial manufacturing stages for producing a type-carrier element of the type shown in FIG. 1.

FIG. 4 is a fragmentary cross-section view taken along lines 4—4 of FIG. 3.

DETAILED DESCRIPTION OF THE INVENTION

Figure 10:
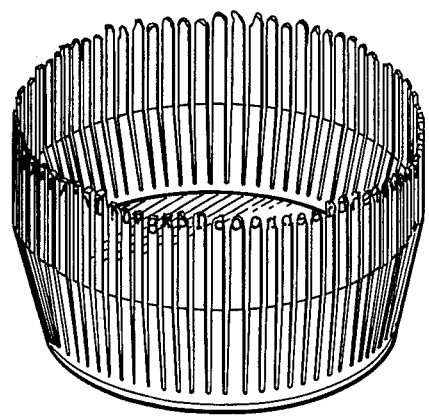
FIG. 10 is a pictorial presentation of a unitary thimble or barrel shaped print-carrier element made from one piece of metal and etched according to the invention.

As previously pointed out, this invention is concerned with type-carrier elements which may assume various configurations and shapes. The preferred print-carrier element configuration is the flat planar disc configuration used in the "daisy wheel" printer and in which a center portion is provided with radially extending flexible arms. However, as shown in FIG. 10, the print-carrier elements of the invention may also be provided in other shapes. For clarity and simplicity, the invention will be described herein in connection with the preferred configuration i.e., a planar disc. It is to be understood that the type-carrier elements described herein will, in use, be fitted with various hublike structures and the like for accommodating them to an operating servo mechanism and mounting means in an impact printer, such as the common office typewriter, teletypewriter, low-speed computer output printer, and the like. Such matters will be obvious to those of ordinary skill in the art and need not be described in detail herein as the invention is specifically concerned with the print or type-carrier element per se and its method of manufacture.

As shown in FIGS. 1 and 2, the preferred type-carrier element of the invention is the planar or flat disc-like element of unitary or one-piece construction which is made of metal. The element is identified at 10. A preferred metal for element 10 is 410 stainless steel. However, other metals may also be used so long as they can be chemically milled, as by etching. For example, 17-7 PH stainless steel, 302 stainless steel, or beryllium-copper alloys, such as Type CA172, may be used.

As is seen in the Figures, carrier element 10 has a plurality of arms 12, sometimes referred to as fingers or beams, extending radially outward from a flat center portion 14. Arms 12, being of flat thin metal, are flexible. However, flexible arms of other cross-sectional configurations may be used. For example, an I-beam cross-section will not only reduce inertia but provide resonance damping. All such variations are within the scope of this invention. Center portion 14 may assume various configurations depending on the type of mounting and indexing mechanism with which it is to be used. It will typically, as shown, have a center opening 16 and a plurality of apertures 18 of various styles and configurations distributed therein.

At the outer ends of each arm on the upper surface thereof, as shown in the top plan view of FIG. 1, there are print or type receiving surface areas 20 having integrally formed type characters 22 thereon in relief. As is typical in the art, any configuration and style of type characters may be selected to provide collectively on the element any desired type font.

The lower surface of the outer ends of arms 12, as shown in the bottom plan view of FIG. 2, comprise impact surfaces 24 against which a printer hammer (not shown) will strike when the element is in use for printing. As is evident, striking the printing surface of any arm 12 will deflect the arm, allowing the type character 22 to be pressed against a contacting surface for causing imprint. It is to be noted that the impact surfaces 24 vary in outline shape. In the interest of minimizing the inertia of the element, particularly at the outer ends of arms 12, unneeded metal is removed in so far as possible to further minimize weight and inertia. Other areas, from which metal may be removed by etching are the open areas within the outline of each character. Such open areas in the characters, for example, the central portion in the letter "O", will additionally provide self-cleaning characters. Such variations are within the scope of this invention. Consequently, outer ends of arms 12 may assume shapes which are somewhat more or less like the print characters 22 carried on each of the printing surfaces 20.

A unitary or one-piece all-metal print-carrier element of the type shown in FIGS. 1 and 2 will have a thickness in the range of about 5 to 20 mils and will consequently have low inertia, light weight, and extended printing life. This is very important in high-speed impact printers where the element is rotated at high angular speeds and repeatedly hammered, causing deflection of the arms and compression of the characters.

Referring now to FIGS. 3-9, one version of a preferred method of fabricating print-carrier element 10 is described in detail. In this particular instance, the final print-carrier element 10 will have an overall thickness of about 5 to 10 mils, 8 mils being preferred when 410 stainless is used. At the outer ends of arms 12 the thickness will be approximately 15 to 20 mils, 18 mils being preferred when 410 stainless is used, including the dimensions of the raised type characters which are in relief thereon. Consequently, the metal sheet from which element 10 is to be formed will in this instance initially be about 18 to 25 mils thick, preferably about 18 when 410 stainless is used.

Broadly, what is described hereinbelow is a preferred etching technique for forming type-carrier element 10. It is to be understood that this represents a preferred embodiment as presently conceived by the inventors. However, variations thereof may be used. The particular technique described employs a negative photoresist material of the type which when exposed to light will harden and any unexposed portions thereof may be removed by use of appropriate solvents. One photoresist material of this type is known as Riston type 211R. A typical developer therefor is Riston type D-2000. Both are available from Dupont Co., Photo Products Department, Wilmington, Del. 19898.

This type of resist has several advantages: it requires a one-sided arm etch that uses thin metal for less metal waste and reduced etchant consumption; the mechanically strong resist film produces straight lines by reducing edge breakdown; the dry film coating is easily applied by a roller coater, which utilizes heated rolls to aid in adhesion between film and metal; it only requires one printing step; deep single-stage etching is possible; and simple processing (it does not require drying and baking); and reduces production cost.

Any commercially available etchant may be used, such as ferric chloride compositions which are well known in the art. Etching from both sides either simultaneously or sequentially is preferably used to eliminate "coil set" stresses and to balance other stresses in the metal.

As can be seen from FIG. 3, the metal sheet 32 from which the type-carrier elements are to be fabricated may contain many carrier elements. For economy in production, it is assumed that a plurality of elements will be made from single large sheets. However, for clarity and description, only the fabrication of one element will be described herein.

The first step in fabrication may consist of a forming operation in which a concave circular area 30 is formed in the upper surface or one side of sheet 32. Concave area 30 is ring shaped as shown, and corresponds to an area on the outer diameter of each type-carrier element 10 on the sheet thus including within its concave area the printing surface area portions 20 at the outer ends of arms 12. The concave area 30 will be shaped so as to conform to the curvature of the platen with which the print-carrier element is to be used. This may vary accordingly. One metal deformation technique which may be used for forming surface 30 is coining. However, any other metal working technique may be used for this purpose as will be apparent to those of ordinary skill in the art. In some cases, no curvature will be necessary or desired and this step may be omitted.

Following deformation and cleaning of the metal with standard cleaning solutions, such as alkaline types, sheet 32 is coated with photoresist, preferably of a type described hereinabove, to a thickness of about 1 to 6 mils. The photoresist is indicated by stippled areas as at 34 in FIGS. 5 and 6 and in subsequent figures. Preferably, photoresist 34 is provided over the entire surface on both sides of sheet 32. However, less than the entire surface may be coated if desired, so long as those areas of the sheet are coated on which the image of the print-carrier element 10 or portions thereof are to be defined.

Following coating of sheet 32 on both sides, front and back, appropriate artwork comprising a mask or pattern (not shown) designed to provide an image in the photoresist is placed thereover. In this particular case, artwork patterns are placed over the front and the back surfaces of metal sheet 32, so as to register with each other and provide aligned front and back surface images of the carrier elements 10, or portions thereof, to be formed from both sides of the sheet. Upon exposure of the surfaces to radiation such as high-intensity ultraviolet radiation, in the case of the Riston negative type photoresist, images resulting from the patterns used are formed, respectively, on both sides of metal sheet 32. Subsequent development of photoresist 34 with appropriate solvents such as Riston type D-2000 developer removes that portion of the photoresist which has not been exposed to the radiation, leaving exposed, hardened areas of photoresist on the front (FIG. 5) and the back (FIG. 6) surfaces of sheet 32.

In this particular instance, the pattern used on the front surface (FIG. 5) was designed to expose areas of the photoresist corresponding to the type characters in circular arrangement in the concave area 30 as shown and the area of the sheet surrounding the characters, as shown at 34.

Figure 5:
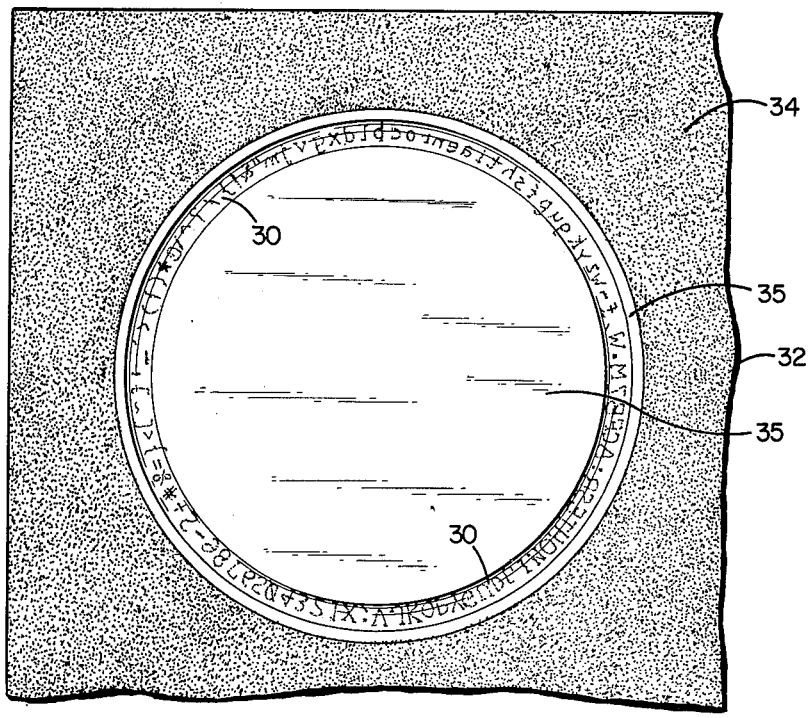
FIG. 5 is a top plan view (front face) of a sheet of metal stock which was coated with photoresist and selected portions thereof were removed.

The remainder of the photoresist, corresponding to the clear areas 35, was not exposed. Consequently, subsequent development removed the unexposed photoresist, leaving the exposed photoresist on the front face of the sheet stock as shown in FIG. 5, the areas indicated at 35 becoming areas of exposed metal stock. In short, it is necessary to remove photoresist from the surfaces of the metal sheet only in places where it is desired that etchant contact metal for effecting chemical milling.

It is to be noted in FIG. 5 that only the overall shape and arrangement of the type characters is defined by the remaining exposed photoresist.

Figure 6:
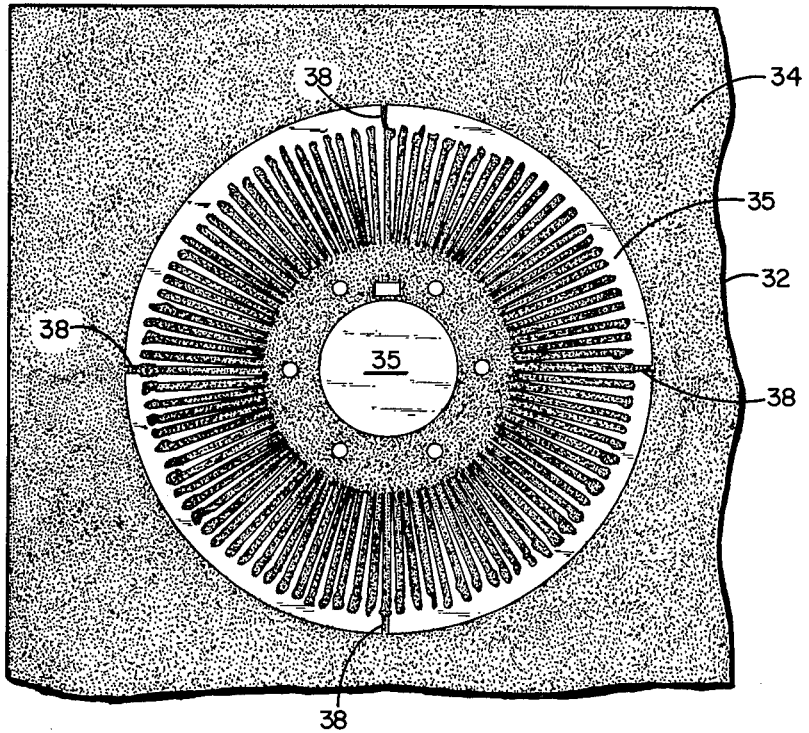
FIG. 6 is a bottom plan view (back face) of the metal stock of FIG. 5 for which selected portions of the photoresist have also been removed.

Similarly, as shown in FIG. 6, the pattern used on the back surface was designed to expose areas of the photoresist corresponding to the overall outline shape of carrier element 10, as shown and the balance of the surface area of the sheet. The remainder of the photoresist, corresponding to the clear areas 35, was not exposed. Consequently, subsequent development removed the unexposed photoresist on the back face of the sheet stock as shown in FIG. 6, the areas indicated at 35 becoming areas of exposed metal stock. Also, selected attachment portions indicated at 38 may be retained to facilitate retention and handling of the carrier elements during the remainder of the fabrication procedure. These portions also retain any exposed photoresist 34 as shown in FIG. 6.

As can be seen from a study of FIGS. 5 and 6, only one pattern is printed on the metal stock, as shown, and the etching procedure used is a true single-stage process with the outside shape of carrier element 10 defined only from the back (FIG. 6) and the type characters defined only from the front (FIG. 5). Consequently, etching from the back will determine the overall shape of the carrier element and front etching will determine the thickness of the element and the shape of the type characters to be formed in relief. Preferably, two etching passes are used on the back to assure uniform arm definition.

Figure 7:
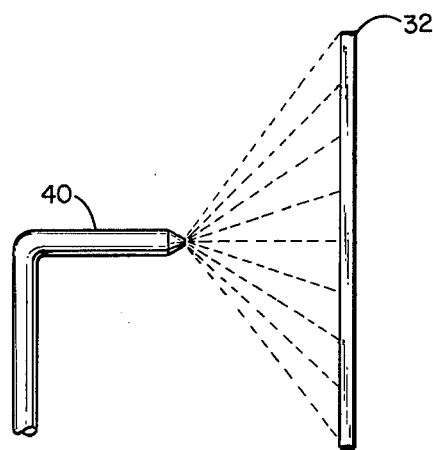
FIG. 7 schematically shows the etching technique utilized in exposing the metal sheet to etchant.

As schematically shown in FIG. 7, the metal sheet 32 in the fabrication stage shown in FIGS. 5 and 6 is then subjected to etching by exposure to heated ferric chloride as by spraying an etchant out of a nozzle 40.

Figure 8:
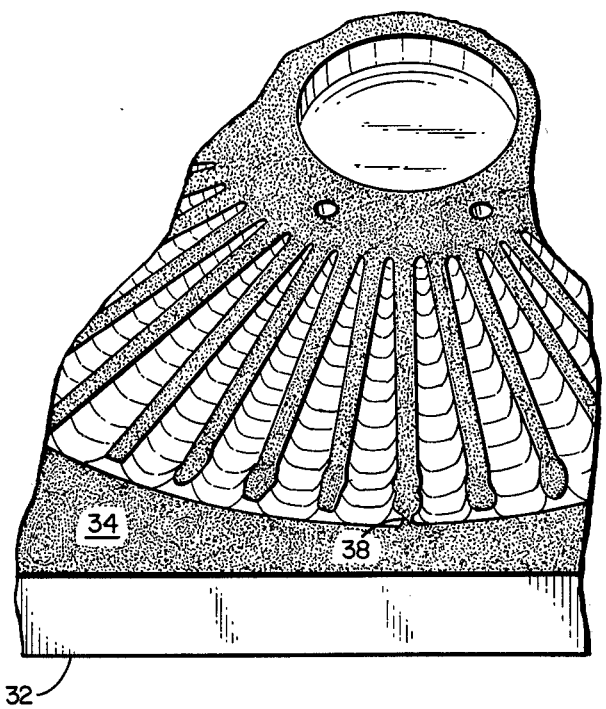
FIG. 8 is a fragmentary perspective view of the metal sheet stock back face shown in FIG. 6 following a preliminary etching step.

The back surface shown in FIG. 6 is preferably etched first, the front surface having been covered to prevent etchant contact with exposed surfaces thereof. Plastic tape is adequate for this purpose. In this particular instance, using 18 mil stock, a preliminary etching is preferably allowed to occur until about 4 mils of exposed surface have been removed from the back side of the sheet. The results are shown in FIG. 8 with the element being partially etched from the sheet stock.

Figure 9:
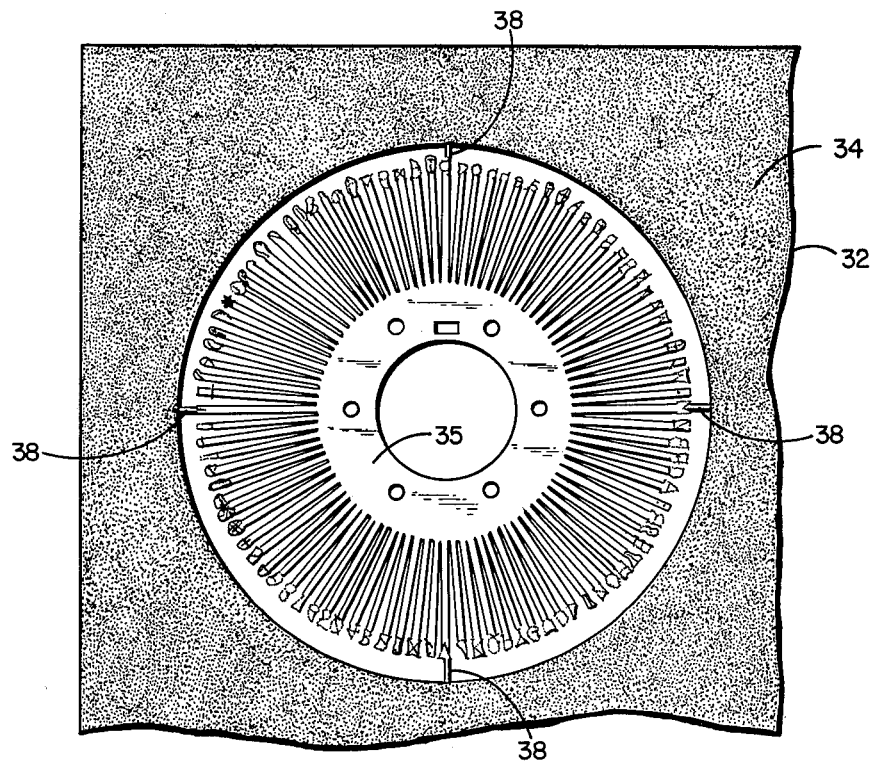
FIG. 9 is a front face view of the metal sheet stock shown in FIG. 8 after the etching is completed.

Following the preliminary etching, the front surface is uncovered and both the front and back surfaces are subjected to final etching, either simultaneously or sequentially. Using 18 mil stock, 10 mils of exposed metal is removed from the front and an additional 10 mils is removed from the back. This causes the etchant to break through the sheet, defining the overall shape of the carrier element including the arms thereof as shown in FIG. 9. It also results in the formation of 10 mil high characters and 8 mil thick arms.

It should be noted that the unitary carrier may be made with a variety of etching techniques. For example, in addition to spray etching, the dip tank technique or the agitated bath technique may be used. Standard commercially available equipment is readily available for any of these techniques.

Following etching, the remaining photoresist 34 is stripped away. The carrier element 10 is cleaned. It is freed from sheet 32 and may be electropolished.

As previously indicated, carrier elements of configurations other than the planar disc-like configuration described above can also be made from one-piece metal by etching in accordance with this invention. For example, the barrel, or thimble configuration 52, shown in FIG. 10, may be made from a single piece of metal. It can be formed flat following which the arms may be bent upward to form the barrel-like sides thereof. Alternatively, a cylindrical piece of metal stock may be etched to form upwardly extending arms in situ.

In both versions, the final carrier structure may be treated to a final finishing etch to sharpen character definition and round off sharp edges. The so-called "cold dip" technique is satisfactory for this purpose.

Having described the invention by way of the above examples and general description, the subject matter in which exclusive rights are claimed is defined as follows:

1. The method of forming from flat metal stock a one-piece type-carrier element of the kind having a center portion and a plurality of arms extending therefrom, each arm having a printing surface including integrally formed type characters, comprising the steps:

coating both front and back surfaces of the metal stock with photoresist material;

forming an image defining the overall shape of the carrier element in the photoresist material on the back surface of the metal stock;

forming an array of images defining selected type characters in the photoresist on the front surface area of the metal stock, each of said images being arranged to register with one of the arms, respectively;

removing photoresist to expose metal stock around the images of the characters on the front side surface of the stock and to expose metal stock around the image shape of the carrier element of the back surface and optionally allowing photoresist to remain on any other areas of the surfaces to facilitate handling during fabrication; and etching the exposed metal stock on both surfaces whereby all of the metal stock surrounding the carrier element is completely removed except for any portions selected to facilitate handling and the type characters are formed in relief on the arms thereof.

2. The method of claim 1 in which the various etching steps on the sides of the metal stock are performed separately on each side.

3. The method of claim 1 in which the various etching steps are performed on both sides of the metal stock simultaneously.

4. The method of any of the preceding claims 1, 2 or 3 in which image formation is by means of exposure of selected portions of the photoresist material to radiation and the removal of photoresist is by selective solvent removal.

5. The method of claim 1 in which the steps thereof are preceded by a coining, grinding, or machining step to form a concave printing surface area corresponding to the location of the type characters to be formed on the metal stock.

6. The method of claim 1 in which the photoresist is the negative type.

7. The method of forming from flat metal stock a one-piece type-carrier element of the kind having a center portion and a plurality of arms extending therefrom, each arm having a printing surface including integrally formed type characters, comprising the steps:

coating the surfaces of the metal stock with photoresist material;

forming an image defining the overall shape of the carrier element in the photoresist material on one surface of the metal stock hereinafter termed the back surface;

forming an array of images defining selected type characters in the photoresist on the other surface area of the metal stock, hereinafter termed the front surface, each of said images being arranged to register with one of the arms on the back surface, respectively;

removing photoresist to expose metal stock around the images of the characters on the front surface of the stock and to expose metal stock around the image shape of the carrier element of the back surface and optionally allowing photoresist to remain on any areas of the surfaces to facilitate handling during fabrication; and etching the exposed metal stock on both surfaces whereby all of the metal stock surrounding the carrier element is completely removed except to facilitate handling and the thickness of the element is decreased overall with the type characters being formed in relief on the arms thereof.

8. The method of forming from flat metal stock a one-piece type carrier element of the kind having a center portion and a plurality of arms extending therefrom, each arm having a printing surface including integrally formed type characters, comprising the steps:

coating the surfaces of metal stock with photoresist material;

forming an image defining the overall shape of the carrier element in the photoresist material on the back surface of the metal stock; forming an array of images defining selected type characters in the photoresist on the front surface area of the metal stock, each of said images being arranged to register with one of the arms, respectively;

removing photoresist to expose metal stock around the images of the characters on the front surface of the stock and to expose metal stock around the image shape of the carrier element of the back surface and optionally allowing photoresist to remain on any areas of the surfaces to facilitate handling during fabrication;

etching the exposed metal stock to a predetermined depth on the back surface of the metal stock in a preliminary etching step;

etching the exposed metal on both surfaces of the metal stock in a primary etching step whereby the thickness of the element being formed is decreased overall and the type characters are formed in relief and any remaining metal stock surrounding the carrier element is completely removed except for any portions selected to facilitate handling.

9. The method of any of the preceding claims 7 or 8 in which image formation is by means of exposure of selected portions of the photoresist material to radiation and the removal of selected areas of photoresist is by selective solvent removal.

10. The method of any of the preceding claims 7 or 8 in which the steps thereof are preceded by a coining, grinding, or machining step to form a concave printing surface area in the metal stock.

11. The method of any of the preceding claims 7 or 8 in which the photoresist is of the negative type.

12. The method of claim 8 in which the primary etching step is accomplished on the front and back surfaces simultaneously.

13. The method of any of the preceding claims 7 or 8 in which all the etching from one side is performed in a single step, followed by all the etching from the other side in a second step.

14. The method of forming from metal stock a one-piece type-carrier element of the kind having a center portion and a plurality of arms extending therefrom, each arm having a printing surface including integrally formed type characters, comprising the steps:

coating both opposing surfaces, hereinafter termed front and back surfaces, of the metal stock with photoresist material;

forming an image defining the overall shape of the carrier element in the photoresist material on the back surface of the metal stock;

forming an array of images defining selected type characters in the photoresist on the front surface area of the metal stock, each of said images being arranged to register with one of the arms on the back surface, respectively;

removing photoresist to expose metal stock around the images of the characters on the front side surface of the stock and to expose metal stock around the image shape of the carrier element of the back surface and optionally allowing photoresist to remain on any other areas of the surfaces to facilitate handling during fabrication; and etching the exposed metal stock on both surfaces whereby all of the metal stock surrounding the carrier element is completely removed except for any portions selected to facilitate handling and the type characters are formed in relief on the arms thereof.

* * * * *